United States Patent [19]

Meyer

[11] 4,096,434
[45] Jun. 20, 1978

[54] AUTOMATIC RANGE SELECTOR FOR VOLT-AMMETER INSTRUMENT

[75] Inventor: William J. Meyer, Laurelton, N.Y.

[73] Assignee: A.W. Sperry Instruments, Inc., Hauppauge, N.Y.

[21] Appl. No.: 754,292

[22] Filed: Dec. 27, 1976

[51] Int. Cl.² .................. G01R 15/08; G01R 1/22
[52] U.S. Cl. ............................... 324/115; 324/127
[58] Field of Search ................ 324/115, 127, 129

[56] References Cited

U.S. PATENT DOCUMENTS

| | | | |
|---|---|---|---|
| 2,905,899 | 9/1959 | Miller et al. | 324/127 |
| 3,197,702 | 7/1965 | Schweitzer, Jr. | 324/127 |
| 3,464,012 | 8/1969 | Webb | 324/115 |

Primary Examiner—Rudolph V. Rolinec
Assistant Examiner—Ernest F. Karlsen
Attorney, Agent, or Firm—Howard C. Miskin

[57] ABSTRACT

An automatic ranging clamp-on ammeter includes an openable normally closed magnetic core for encircling an A.C. current carrying cable has a measuring winding and a sensing winding. A current meter, a diode rectifier and a pair of variable first and second resistors are connected in series across the measuring winding. A relay solenoid is shunted by a Zener diode and is connected in series with a variable resistor across the sensing winding. A sensitivity reducing shunt variable resistor is connected through the relay normally open contacts betwen the junction of the first and second resistors and the meter opposite terminal. An audible signal generator may be connected across the shunt resistor. When the measured current exceeds a predetermined value the relay closes and inserts the shunt resistor across the meter to reduce the measuring sensitivity and increase its range and energizes the audible signal generator. Alternatively the current from the sensing winding is rectified and fed through a first resistor to a meter, the series connected first resistor and meter being shunted by a series connected unidirectional switch and second resistor whose gate is connected to the rectified current by way of a capacitor and resistor so that the switch is closed when the rectified voltage exceeds a set value to increase the meter range.

8 Claims, 4 Drawing Figures

AUTOMATIC RANGE SELECTOR FOR VOLT-AMMETER INSTRUMENT

BACKGROUND OF THE INVENTION

The present invention relates generally to improvements in electrical measuring instruments and it relates more particularly to an improvised multirange meter of the clamp-on or snap-on type.

The measuring of the alternating current traversing a cable with an ordinary ammeter is at best a very difficult task since the meter must be inserted in series with the cable circuit or a line carrying a known fraction of the current through the cable. A conventional meter device now widely available and employed to overcome the above drawbacks is the so-called clamp-on or snap-on ammeter in which a snap-on magnetic core is opened and closed around the alternating current carrying cable which induces a varying magnetic flux in the core which is a function of the cable carried alternating current. An A.C. voltage meter is connected to a winding on the magnetic core and provides a reading calibrated in accordance with the cable carried current. While the clamp-on ammeter is highly satisfactory, it possesses some drawbacks and disadvantages. The alternating current traversing different cables may vary over a wide range so that if a low sensitivity meter is applied to a low current carrying cable, an accurate reading is not available. On the other hand, when a high sensitivity meter is applied to a high current carrying cable there is a high probability of damaging the meter, frequently beyond repair. Accordingly, the conventional clamp-on meter is of little versatility and adaptability, and otherwise leaves much to be desired.

SUMMARY OF THE INVENTION

It is therefore a principal object of the present invention to provide an improved electrical measuring instrument.

Another object of the present invention is to provide an improved clamp-on ammeter.

Still another object of the present invention is to provide an improved multirange clamp-on ammeter.

A further object of the present invention is to provide an improved clamp-on ammeter which automatically transfers to optimum sensitivity.

Still a further object of the present invention is to provide an instrument of the above nature characterized by its reliability, ruggedness, simplicity, ease of operation, and high versatility and adaptability.

The above and other objects of the present invention will become apparent from a reading of the following description taken in conjunction with the accompanying drawing which illustrates preferred embodiments thereof.

In a sense, the present invention contemplates the provision of an automatic ranging clamp-on ammeter in which a voltage measuring network is connected across a measuring winding on the ammeter clamp-on magnetic core and which includes means responsive to the alternating flux in the magnetic core for varying the network sensitivity.

In the preferred form of the improved instrument, the voltage measuring network includes in successive series connection across the measuring winding a current meter, a rectifier and a pair of first and second variable resistors for calibrating the instrument. The sensitivity varying means includes a variable shunting resistor connected through the normally open contacts of a relay between the junction of the first and second variable resistors and the junction of the current meter and measuring winding. The relay solenoid is connected in series with a variable resistor and rectifier across a sensing winding on the magnetic core and is shunted by a Zener diode. Advantageously, an electrically energized audible signal generator is connected across the shunt resistor. Moreover, in the alternative, a device of greater simplicity and compactness may be achieved by employing the measuring coil as the sensing coil as well, thereby obviating the latter and substituting a semiconductor switch for the relay, as will be hereinafter described in detail.

The improved clamp-on ammeter is normally in a low range or sensitive state, and where the measured current exceeds the low range maximum, the measuring network sensitivity is automatically decreased to increase the meter range, thereby minimizing the chances of damage to the meter in a simple and inexpensive manner, extending the meter accuracy and range of providing higher versatility of adaptability.

DESCRIPTION OF THE PREFERRED EMBODIMENTS

Figure 1:
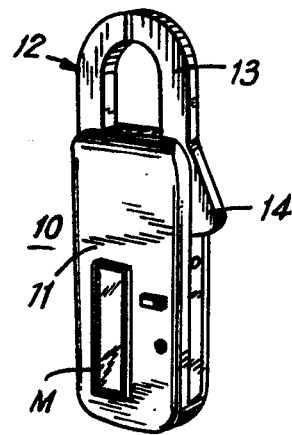
FIG. 1 is a perspective view of a clamp-on ammeter embodying the present invention.
Figure 2:
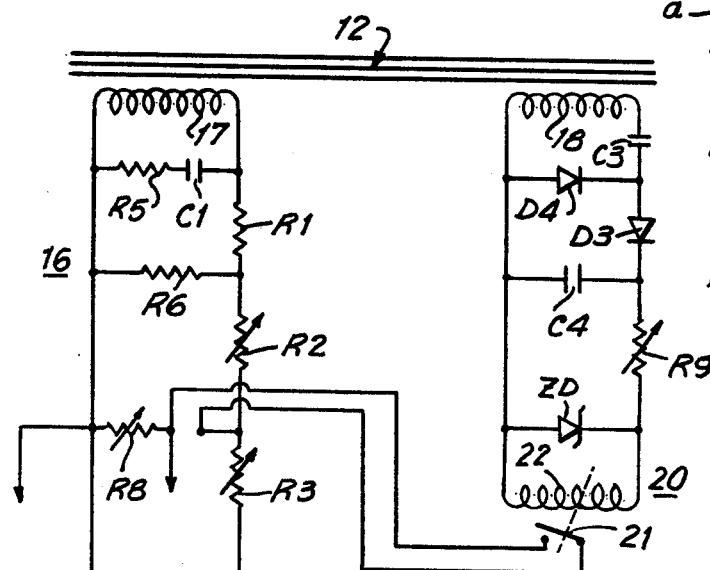
FIG. 2 is a circuit diagram of the measuring and sensitivity control network thereof.

Reference now to the drawings, particularly FIGS. 1 and 2 thereof, which illustrates a preferred embodiment of the present invention, the reference numeral 10 generally designates the improved automatic ranging clamp-on ammeter which includes a suitably shaped, conveniently handled housing or case 11 and a magnetic transformer core 12 projecting from an end of the housing 11. The magnetic core 12 may be of conventional construction and composition as those normally employed in clamp-on ammeters, being normally closed to provide a low magnetic reluctance path and including a normally closed jaw section 13 which is selectively swingable to an open position by finger pressure on an actuating or finger piece portion 14 thereof. By opening jaw 13 the magnetic core may be applied to a current carrying cable and release of the finger piece portion 14 effects the closing of the jaw 13 and the closing of the magnetic core about the current carrying cable.

Housed in the case 11 is the current responsive alternating magnetic flux measuring and automatic range or sensitivity varying network which includes a measuring or first core and a sensing or second coil 18 wound in or engaging the magnetic core 12 and responding to the alternating or varying magnetic flux therein. A current member M is housed in case 11 and has a dial face visible through a window in the front face of case 11.

A first terminal of coil 17 is connected directly to a first terminal of meter M and the second opposite terminal of coil 17 is connected to the second opposite terminal of meter M through the successively series connected resistor R1, variable resistor R2, variable resistor R3, resistor R4, and similarly oriented series connected rectifier diodes D1 and D2. The core 17 is shunted by the series connected resistor R5 and capacitor C1 and the junction of resistors R1 and R2 is connected through a resistor to the first terminal of coil 17. The meter M is shunted by a capacitor C2.

The meter 10 may be employed as a volunteer by the provision of a pair of terminals accessible from the outer face of case 11. One of the terminals 19 is connected through a resistor R7 to the junction of diodes D1 and D2 and the other terminal 19 is connected to the first terminal of the current meter M.

The automatic ranging network comprises a relay 20 including a pair of normally open contacts 21, advantageously of the reed type, actuated by a solenoid 22, energization of which above a predetermined level closes contacts 21. A variable shunt resistor R8 has one terminal connected to the first terminal of meter M and its other terminal connected through relay contacts 21 to the junctions of resistors R2 and R3.

A first terminal of coil 18 is directly connected to one terminal of solenoid 22 and the other terminal of coil 18 is connected to the other terminal of solenoid 22 by the successively series connected capacitor C3, rectifier diode D3 and variable resistor R9. A diode D4 is connected between the first terminal of coil 18 and the junction of capacitor C3 and diode D3. A capacitor C4 is connected between the first terminal of coil 18 and the junction of diode D3 and resistor R9 and the solenoid 22 is hunted by a voltage limiting Zener diode ZD.

In the operation of the improved automatic ranging clamp-on ammeter described above, the magnetic core is applied to and encircles a cable, the current through which is to be measured to induce an alternating magnetic flux in core 12 of a value corresponding to the cable current. An alternating current is thus induced in coil 17, and the resulting alternating voltage across the coil 17 is measured by the coupled rectifier network and indicated on the meter M. In the event that the current through the measured cable is within the range of the corresponding voltage measuring circuit without shunt resisitor R8, the current energizing solenoid 22 as derived from coil 18 is insufficient to actuate contacts to their closed condition. Should the current carried by the cable being measured exceed the range of the measuring circuit range without the shunt resistor R8, that is in the circuit low range high sensitivity, the current induced in coil 18 is sufficient to energize solenoid 22 an amount to actuate contacts 21 to a closed condition to insert shunt resistor R8 into the measuring circuit thereby reducing the measuring circuit sensitivity and increasing the range thereof.

The transfer point of relay 20 is adjusted by variable resistor R9 to occur at about the maximum reading on meter M in its low range condition. The meter M is calibrated in both ranges by means of variable resistors R2, R3 and R8, the latter being employed only in the adjustment in the high range.

Figure 3:
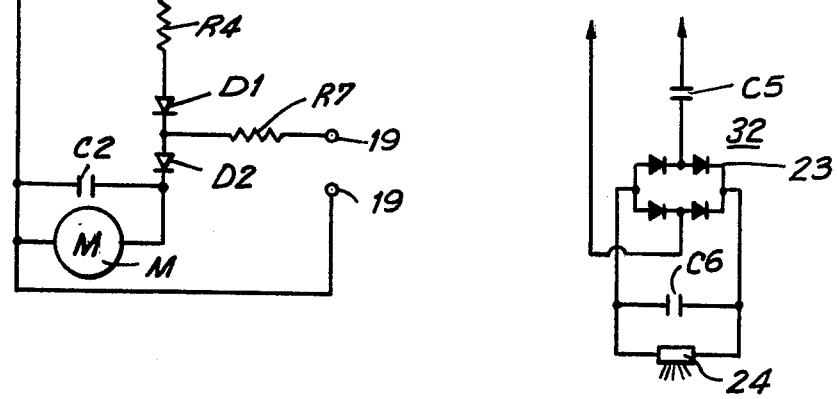
FIG. 3 is a circuit diagram of a supplementary alarm network which may be used with the network of FIG. 2.

An alarm network 32 as shown in FIG. 3 may be included in the snap-on ammeter 10. The alarm network 32 includes a bridge type full wave diode rectifier output input corners of which are connected through a capacitor C5 to respective terminals of resistor R8. The opposite output terminals of bridge rectifier 23 are connected to the input terminals of any suitable, preferably high impedance input D.C. electrically energized audible signal generator 24 which is shunted by a capacitor C6. With the inclusion of the supplementary alarm network 22, upon the closing of relay contacts 21 attendant to the current through the measured cable exceeding a predetermined level, specifically the meter range transfer level, the network 32, and hence the generator 24 are energized to provide an audible signal.

The networks described above may be greatly simplified and made more compact in many ways. For example, a semiconductor switch may be substituted for the relay 20 and the measuring coil 17 may be employed as the flux sensing coil, thus obviating the separate sensing coil 18.

Figure 4:
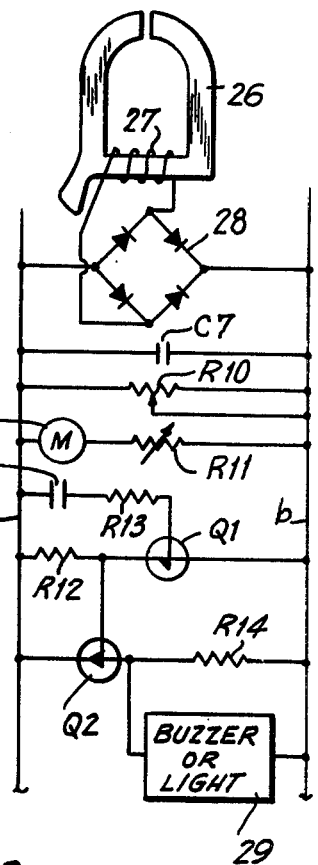
FIG. 4 is a circuit diagram of a further embodiment of the present invention.

Thus, referring to FIG. 4 of the drawings the reference numeral 26 designates a magnetic core of the clamp-on type corresponding to the magnetic core 12 and has wound thereon a measuring and sensing coil 27. The terminals of the coil 27 are connected to respective opposite input terminal of a semiconductor diode bridge rectifier 28 whose opposite D.C. output terminals are shunted by a capacitor C7 and by the resistance element of a potentiometer R10. One terminal of the resistance element of potentiometer R10 is connected to a line "a" and the arm of potentiometer R10 is connected to a line "b".

A micrometer M1 is connected in series with a variable resistor R11 between lines "a" and "b". A semiconductor unidirectional switch, such as a silicon unidirectional switch Q1 which transfers between open and closed conditions as the current therethrough respectively drops below and exceeds a predetermined value, has one output electrode connected to line "b" and its other output electrode connected through a meter shunting resistor R12 to line "a". The gate of unidirectional switch Q1 is connected to line "a" through the series connected resistor R13 and capacitor C8.

An alarm or signal network includes a thyrister such as a silicon controlled rectifier Q2 connected in series with a resistor R14 between lines "a" and "b", the resistor 29 being shunted by a low power electrically energized signal device 29 such as a light emitting diode or solid state buzzer. It should be noted that thyrister Q2 and resistor R14 may be omitted and the signal device 29 connected directly across the resistor R12.

The application of the device last described is similar to that first described. When the clamped cable current being measured exceeds a predetermined value, the voltage across unidirectional switch Q1, as derived through coil 27, rectifier 28 and potentiometer R10 exceeds the firing voltage of switch Q1 to close the switch Q1. The closing of switch Q1 inserts the resistor R12 in shunt with the meter M1 and resistor R11 to bypass a predetermined fraction of the current traversing the meter M1 and place the meter in the high current range of the clamp-on ammeter. Simultaneously with the closing of switch Q1 a firing signal derived from the junction of resistor R12 and switch Q1 is applied to the gate of thyrister Q2 to close the thyrister and thereby energize the alarm device 29. On the other hand, when the cable current is below a predetermined value the voltage across switch Q1 is insufficient to close the switch Q1 so that the meter M1 is not shunted by resistor R12 and is thus in its low or sensitive range. Furthermore, in the latter condition the thyrister Q2 remains open and the alarm device deenergized.

While there have been described and illustrated preferred embodiments of the present invention, it is apparent that numerous alterations, additions and omissions may be made without departing from the spirit thereof.

I claim:

1. An automatic ranging clamp-on ammeter comprising a clamp-on magnetic core including a section movable between the core open and closed positions, a measuring coil encircling said core, means for measuring the voltage across said measuring coil including a meter and rectifier and a resistor connected in series across said measuring coil and means responsive to the varying magnetic flux in said core for varying the sensitivity of said voltage measuring means including a sensing coil encircling said magnetic core, a shunt resistor and means including a relay having a control input responsive to the output of said sensing coil and having a switch output connected in series with said shunt resistor across said meter whereby variation of said sensing coil output above and below a predetermined level alternatively opens or closes said switch to correspondingly vary said sensitivity.

2. The ammeter of claim 1 wherein said relay input includes a solenoid connected across said sensing coil and said relay switch output comprises a pair of contacts transferred between open and closed condition in response to the energization of said solenoid.

3. An automatic ranging clamp-on ammeter comprising a clamp-on magnetic core including a section movable between core-open and closed positions, a measuring coil encircling said core, means for measuring the voltage across said measuring coil including first and second variable resistors and a rectifier and a meter connected in series across said measuring coil and means responsive to the varying magnetic flux in said core for varying the sensitivity of said voltage varying means and including a sensing coil encircling said magnetic core, a relay including normally open contacts and a contact transfer solenoid, means including a variable resistor connected in series with said solenoid across said sensing coil and a variable shunt resistor connected through said relay contacts between the junction of said first and second variable resistors and a terminal of said current meter whereby when the output of said sensing coil exceeds a predetermined value said solenoid is sufficiently energized to transfer said relay contacts to a closed condition and complete the circuit of said shunt resistor across said meter and decrease the sensitivity of said voltage measuring means.

4. The ammeter of claim 1 wherein said shunt resistor is variable.

5. The ammeter of claim 2 including a variable resistor connected between said solenoid and said sensing coil.

6. The ammeter of claim 1 including means responsive to the actuation of said relay for generating an audible signal.

7. The ammeter of claim 1 including a Zener diode connected across said solenoid.

8. The ammeter of claim 1 wherein said series connected resistor is variable.

* * * * *